(12) United States Patent
Kataria

(10) Patent No.: US 6,804,118 B2
(45) Date of Patent: Oct. 12, 2004

(54) THERMAL DISSIPATION ASSEMBLY FOR ELECTRONIC COMPONENTS

(75) Inventor: Vijay Kataria, Kokomo, IN (US)

(73) Assignee: Delphi Technologies, Inc., Troy, MI (US)

( * ) Notice: Subject to any disclaimer, the term of this patent is extended or adjusted under 35 U.S.C. 154(b) by 166 days.

(21) Appl. No.: 10/099,898

(22) Filed: Mar. 15, 2002

(65) Prior Publication Data

US 2003/0174455 A1 Sep. 18, 2003

(51) Int. Cl.[7] .......................... H05K 7/20; B21D 53/02
(52) U.S. Cl. .................. 361/705; 361/704; 361/709; 361/718; 29/890.03; 29/890.35
(58) Field of Search ................... 361/705, 690, 361/702, 703, 704, 709, 712, 713, 718; 29/890.035, 890.03, 428, 458

(56) References Cited

U.S. PATENT DOCUMENTS

| | | | | |
|---|---|---|---|---|
| 4,698,662 A | * | 10/1987 | Young et al. ............. 257/777 |
| 5,026,748 A | * | 6/1991 | Adams et al. ............. 524/66 |
| 5,309,979 A | | 5/1994 | Brauer | |
| 5,367,193 A | * | 11/1994 | Malladi ................ 257/707 |
| 5,550,406 A | * | 8/1996 | McCormick ............ 257/666 |
| 5,561,322 A | * | 10/1996 | Wilson ................ 257/703 |
| 5,985,697 A | * | 11/1999 | Chaney et al. ........... 438/122 |
| 6,069,023 A | * | 5/2000 | Bernier et al. .......... 438/107 |
| 6,156,980 A | | 12/2000 | Peugh et al. | |
| 6,180,436 B1 | | 1/2001 | Koors et al. | |
| 6,365,964 B1 | | 4/2002 | Koors et al. | |
| 6,452,278 B1 | * | 9/2002 | DiCaprio et al. ........ 257/777 |
| 2003/0150604 A1 | * | 8/2003 | Koning et al. .......... 165/185 |

\* cited by examiner

*Primary Examiner*—Anatoly Vortman
(74) *Attorney, Agent, or Firm*—Stefen V. Chmielewski

(57) ABSTRACT

An electrical assembly 10 is provided, including a heat sink 14, a heat generating component 12, a gap 22 defined between the heat generating component 12 and the heat sink 14, at least one pre-cured thermal adhesive member 26 positioned within the gap 22, and a post-cured thermal adhesive filling said gap 22.

7 Claims, 1 Drawing Sheet

THERMAL DISSIPATION ASSEMBLY FOR ELECTRONIC COMPONENTS

TECHNICAL FIELD

The present invention relates generally to a thermal dissipation assembly for use with electronic components and more particular to a thermal dissipation assembly with improved electrical short resistance.

BACKGROUND OF THE INVENTION

Electronic assemblies are designed in a wide variety of configurations for a wide variety of individual applications. It is common for these electronic assembles, however, to include electronic components that generate heat during operation. Although this generated heat may be acceptable in certain assemblies and applications, in others this generated heat poses a danger to the electronic assembly. Generated heat my result in damage to the electronic component, surrounding components, or the electronic assembly as a whole. In addition, many electronics components fail to operate properly if their temperatures are not kept within a predetermined range. It is therefore, usually highly desirable to dissipate heat generated within the electronics assembly.

One standard approach to the dissipation of heat generated within the electronic assembly is through the use of heat sink components. Heat sink components are well known in the prior art and may take on a variety of forms, including cases, heat rail brackets, and a host of other embodiments. The heat sink component allows heat generated by electronic components to pass into the heat sink and thereby allow the heat generating electronic components to remain at a safe temperature. The heat sink component must remain in sufficient thermal contact with the heat generating electronic component in order to properly dissipate the electronic component's heat. Although the heat sink component must retain sufficient thermal contact, in many applications it must also retain electrical separation from the electronic components. If electrical separation is not maintained, electrical shorts and failure of the electronics assembly may occur. The existence of electrical shorts is known to result in decreased customer satisfaction, increased scrap costs, poor product performance, and increase warranty costs.

One successful method of providing thermal communication while retaining electrical separation has been through the use of thermally conductive adhesives. By filling the gap between a heat generating electronics component and the heat sink with thermally conductive adhesive, heat is allowed to pass from the electronics component into the heat sink. In addition, thermally conductive adhesives are commonly not electrically conductive and therefore can be used to provide the electrical separation between the heat generating electronics component and the heat sink. Although thermally conductive adhesives may be non-conductive and therefore provide electrical separation between the electronics component and the heat sink, often the thermally conductive adhesives do not provide the physical barrier necessary to separate the electronics component from the heat components until the thermally conductive adhesive is cured. As an example, when the substrate of an electronics assembly is mounted to the heat sink, the heat generating electronics component may be pressed towards the heat sink due to the clamping forces created between the substrate and the heat sink. This can still cause the electronics component to penetrate the thermally conductive adhesive and come in contact with the heat sink components during assembly. As has been discussed, contact between the electronics component and the heat sink can result in electrical shorts and other undesirable results. A solution to prevent such penetration would be desirable.

One solution, found in the prior art, to providing the required physical separation while using thermally conductive adhesives has been to introduce glass beads into the thermally conductive adhesive. The glass beads, commonly distributed randomly in the adhesive, are used as a physical separator between the electronics component and the heat sink component in order to reduce penetration of the electronics component through the adhesive. Although glass beads have been developed to reduce in incidents of electrical shorts, ironically they may actually cause such faults in certain situations. Often as portions of electronics assembly are mounted to the heat sink (or experience other assembly processes) the gap between the electronics component and the heat sink experience clamping forces. These clamping forces can force the glass beads during manufacturing to penetrate the soft heat conducting surfaces of the electronics component or heat sink. When these glass beads penetrate, they can push out the metal around them, and thereby cause an electrical short between the electronics component and the heat sink surface or even an electrical short within the electronics component itself. This may not only cause the assembly to malfunction, but it may also result in precisely the same undesirable result that the glass beads were originally designed to avoid. Although this scenario may be avoided by precise control of the clamping forces or improved control of spacing tolerances, this is often not practical due to the variation in thickness of electronic components from various manufacturers. The variation in thickness of various electronic components can require adjustments in assembly tolerances and forces that are impractical or costly to implement. Implementing such precise control over the clamping forces may result in undesirable increases in complexity, cost, and assembly time.

It would, therefore, be highly desirable to have a thermal dissipation assembly that provided the benefits of thermally conductive adhesives, that provided adequate physical separation between the electronics component and the heat sink components, and that had a reduced sensitivity to clamping forces during assembly.

SUMMARY OF THE INVENTION

It is, therefore, an object of the present invention to provide a thermal dissipation assembly for use with an electronics assembly that provides thermal dissipation between an electronic component and a heat sink while providing adequate electrical and physical separation between the two components. It is a further object of the present invention to provide a thermal dissipation assembly with reduced sensitivity to assembly clamping forces.

In accordance with the objects of the present invention, an electronics assembly is provided including a heat generating component and a heat sink positioned in relation with one another to form a gap. A plurality of pre-cured thermal conductive material elements are positioned within the gap to create a physical barrier between the heat generating component and the heat sink. A post-cured thermal conductive material fills in the gap allowing the thermal energy from the heat generating component to be transferred to the heat sink.

Other objects and features of the present invention will become apparent when viewed in light of the detailed description of the preferred embodiment when taken in conjunction with the attached drawings and appended claims.

DESCRIPTION OF THE PREFERRED EMBODIMENT(S)

Figure 1:
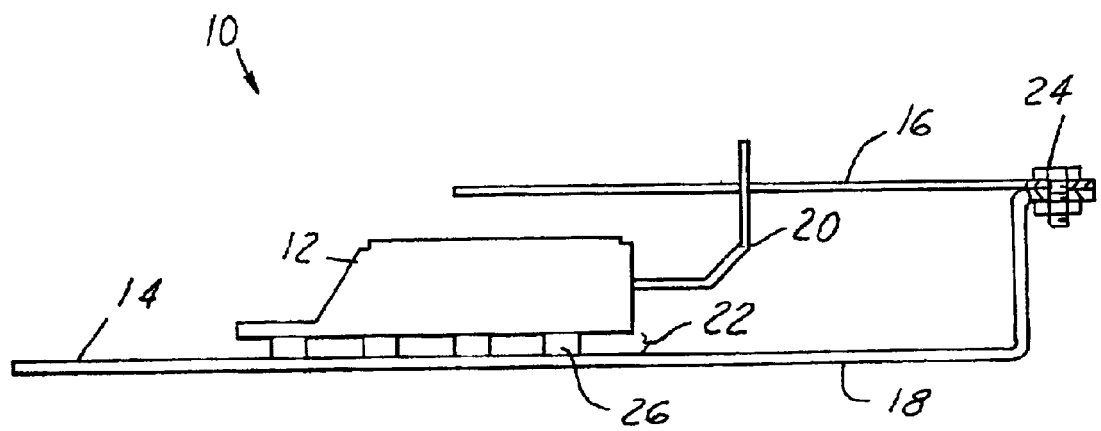
FIG. 1 is a cross-sectional illustration of one embodiment of an electronics assembly with thermally conductive element in accordance with the present invention, the electronics assembly shown without the post-cured thermal conductive material for illustrative purposes.

Referring now to FIG. 1, which is an illustration of an electronics assembly 10 in accordance with the present invention. The electronics assembly 10 includes a heat generating component 12 and a heat sink 14. In one embodiment, the heat generating component 12 is an electronic component that generates heat during operation, although a variety of heat generating components 12 are contemplated. Similarly, a wide variety of heat sinks 14 are known in the prior art and contemplated by the present invention. Heat sinks 14 may take the form of metal cases, heat rail components, brackets, fins, or a variety of other configurations.

Although the electronic assembly 10 may be assembled in a variety of fashions, in one embodiment the heat generating component 12 is mounted to a substrate 16 that in turn is mounted to a case 18. The heat generating component 12 is illustrated as an electrical component in communication with the substrate 16 through the use of electrical contacts 20. In the illustrated embodiment, the case 18 acts as the heat sink 14, although in other embodiments an independent separate heat sink 14 member may be utilized. The heat generating component 12 is mounted in proximity to the heat sink 14 such that a gap 22 is defined between the two. It is desirable to fill this gap such that the heat generating component 12 is in thermal communication with the heat sink 14 while remaining electrically isolated from the heat sink 14. In this fashion, heat can be dissipated from the heat generating component 12 without danger of the heat generating component 12 shorting out electrically through contact with the heat sink 14.

The difficulty with the with the assembly of designs using only the aforementioned components comes to play due to the tolerances and clamping forces experienced during assembly. Variations in the manufacture, type, origination, and style of the heat generating component 12 are known to cause variances in the gap 22. Similarly, differences in other assembly parts or force applied to clamping mechanisms 24 may also vary the size of the gap 22. It should be understood that the clamping mechanism 24 attaching the substrate 16 to the case 18 is only on potential assembly design. Although the size of the gap 22 may vary, it is often important to insure that the heat generating component 12 does not physically contact the heat sink 14 in order to prevent electrical shorts. The common use of thermally conductive adhesives alone commonly does not provide the physical barrier necessary to prevent contact if the gap 22 is diminished or clamping forces are increased.

The present invention, therefore, further includes at least one pre-cured thermal adhesive member 26 positioned with the gap 22. The pre-cured thermal adhesive member 26 provides a sufficient physical barrier to prevent the heat generating component 12 from contacting the heat sink 14. It is contemplated that the pre-cured thermal adhesive member 26 may be placed within the gap 22 in a variety of fashions. In one embodiment, the pre-cured thermal adhesive member 26 may be formed on the heat sink 14 prior to assembly. In a second embodiment the pre-cured thermal adhesive member 26 may be placed within the gap 22 prior to assembly. In still another, the pre-cured thermal adhesive member 26 may be formed in the heat generating component 12 prior to assembly. One advantage of this last embodiment is that the height of the pre-cured thermal adhesive member may be matched to the particular dimensions of individual heat generating components 12 and thereby allow the substitution of a variety of different heat generating components 12 during assembly while providing a consistent gap 22.

Figure 2:
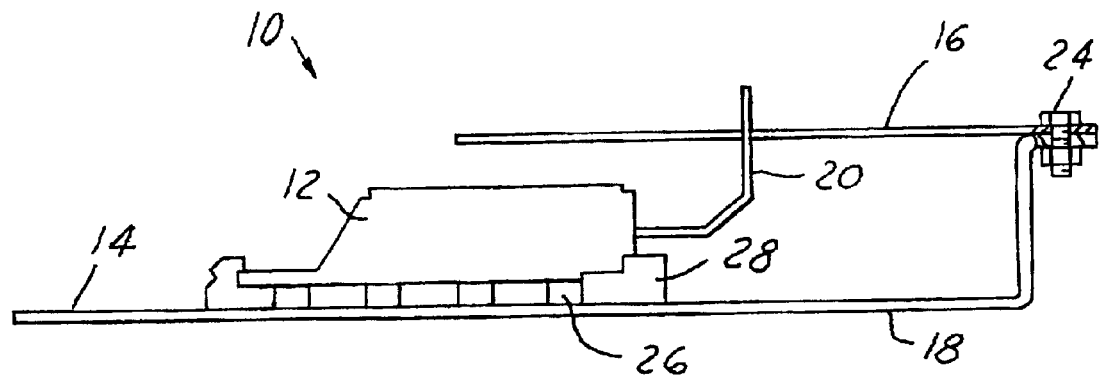
FIG. 2 is a cross-sectional illustration of one embodiment of and electronics assembly with thermally conductive element in accordance with the present invention.

The pre-cured thermal adhesive member 26 may be formed in a variety of configurations. In one embodiment, the pre-cured thermal adhesive members 26 may be simple droplets while in others more complex geometrical shapes may be utilized. The present invention makes the exact configuration less critical by including a post-cured thermal adhesive member 28 (see FIG. 2). The post-cured thermal adhesive member 28 fills the remaining gap 22 to provide a consistent thermal connection between the heat generating member 12 and the heat sink 14. The post-cured thermal adhesive member 28 is cured after assembly such that the heat generating component 12 is thermally bonded to the heat sink 14. The use of thermal adhesives is well known in the art and a variety of thermal adhesives are contemplated by the present invention. The use of a post-cured thermal adhesive member 28 allows thermal communication between the heat generating component 12 and the heat sink 14 while providing electrical isolation. When used in combination with the pre-cured thermal adhesive 26, the present invention further provides a physical barrier between the heat generating component 12 and the heat sink 14. The use of pre-cured thermal adhesive 26 gives a greater control of the dimensions of the physical barrier when compared to the use of glass beads, or other components mixed in the adhesive, and therefore can be utilized without causing damage to the components during assembly.

While particular embodiments of the invention have been shown and described, numerous variations and alternative embodiments will occur to those skilled in the arm. Accordingly, it is intended that the invention be limited only in terms of the appended claims.

What is claimed is:

1. A method of applying thermal adhesive to an electronics assembly comprising:

forming a plurality of pre-cure thermal adhesive members;

curing said plurality of pre-cure thermal adhesive members;

applying a post-cure thermal adhesive;

assembling an electronics assembly including a heat generating component and a heat sink such that said plurality of pre-cure thermal adhesive members and said post-cure thermal adhesive are positioned within a gap formed between said heat generating component and said heat sink; and curing said post-cure thermal adhesive.

2. A method as described in claim 1 wherein said plurality of pre-cure thermal adhesive members are formed on said heat generating component.

3. A method as described in claim 1 wherein said plurality of pre-cure thermal adhesive members are formed in said heat sink.

4. A method as described in claim 1 wherein said heat generating component is an electrical component.

5. A method as described in claim 1 wherein said forming a plurality of pre-cure thermal adhesive members includes forming droplets of pre-cure thermal adhesive.

6. A method as described in claim 1 wherein said post-cure thermal adhesive is applied to said heat generating component.

7. A method as described in claim 1 wherein said post-cure thermal adhesive is applied to said heat sink.

* * * * *